US010354593B2

(12) United States Patent
Murakami et al.

(10) Patent No.: US 10,354,593 B2
(45) Date of Patent: Jul. 16, 2019

(54) DISPLAY APPARATUS

(71) Applicant: Japan Display Inc., Tokyo (JP)

(72) Inventors: Yuta Murakami, Tokyo (JP);
Masahiro Kubota, Tokyo (JP); Norio Nakamura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/800,600

(22) Filed: Nov. 1, 2017

(65) Prior Publication Data

US 2018/0130416 A1     May 10, 2018

(30) Foreign Application Priority Data

Nov. 4, 2016  (JP) ................................ 2016-216596

(51) Int. Cl.
G09G 3/3258    (2016.01)
G09G 3/3233    (2016.01)
H01L 27/32     (2006.01)

(52) U.S. Cl.
CPC ......... *G09G 3/3258* (2013.01); *G09G 3/3233* (2013.01); *G09G 2300/043* (2013.01); *G09G 2300/0819* (2013.01); *G09G 2300/0842* (2013.01); *G09G 2300/0861* (2013.01); *G09G 2300/0866* (2013.01); *G09G 2300/0871* (2013.01); *G09G 2310/0289* (2013.01); *G09G 2320/0233* (2013.01); *G09G 2320/0247* (2013.01); *G09G 2320/0626* (2013.01); *H01L 27/3213* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 2012/0169954 A1* | 7/2012 | Liu ..................... | G09G 3/3611 349/38 |
| 2012/0268501 A1* | 10/2012 | Mizukoshi .......... | G09G 3/3233 345/690 |
| 2012/0287171 A1 | 11/2012 | Mizukoshi et al. | |
| 2015/0145898 A1* | 5/2015 | Hwang ............... | G09G 3/3688 345/690 |

FOREIGN PATENT DOCUMENTS

| | | |
|---|---|---|
| JP | 2011-17758 A | 1/2011 |
| JP | 2013-101259 A | 5/2013 |

* cited by examiner

*Primary Examiner* — Christopher J Kohlman
(74) *Attorney, Agent, or Firm* — K&L Gates LLP

(57) ABSTRACT

A display apparatus includes: a display device including pixels each including a light emitting element; a voltage generator configured to generate a plurality of different voltages; a switching device configured to be capable of switching the voltages in a manner such that any one of the voltages is applied to each of the pixels; and a controller configured to control operation of the switching device. The controller is configured to cause, at least once during a period for displaying an image corresponding to one frame, the switching device to operate in a manner such that voltages applied to the pixel are switched from a lower to a higher voltage.

6 Claims, 12 Drawing Sheets

US 10,354,593 B2

DISPLAY APPARATUS

CROSS-REFERENCE TO RELATED APPLICATIONS

This application claims priority from Japanese Application No. 2016-216596, filed on Nov. 4, 2016, the contents of which are incorporated by reference herein in its entirety.

BACKGROUND

1. Technical Field

The present invention relates to a display apparatus.

2. Description of the Related Art

Display apparatuses that include pixels using organic electroluminescence (EL) have been known (for example, Japanese Patent Application Laid-open Publication No. 2013-101259 A).

SUMMARY

According to one aspect, a display apparatus includes a display device including pixels each including a light emitting element, a voltage generator configured to generate a plurality of different voltages, a switching device configured to be capable of switching the voltages in a manner such that any one of the voltages is applied to each of the pixels, and a controller configured to control operation of the switching device. At least once during a period for displaying an image corresponding to one frame, the controller is configured to cause the switching device to operate in a manner such that voltages applied to the pixel are switched from a lower to a higher voltage.

DETAILED DESCRIPTION

In the display apparatus using organic EL, the luminance of the pixels decreases over time after a frame image is updated. Consequently, the difference in luminance between times immediately preceding and immediately following update of a frame image, that is, when the luminance is the lowest and when the luminance is the highest, is visually recognized as a flicker in some cases.

For the foregoing reasons, there is a need for providing a display apparatus capable of preventing flickers due to the difference in luminance from occurring over a period from before to after the update.

The following describes an embodiment of the present invention with reference to the drawings. The disclosure is merely an example, and the present invention shall include embodiments obtained by making appropriate changes that the skilled person can easily conceive of without departing from the gist of the invention. While the drawings may illustrate geometries such as widths, thicknesses, and shapes schematically as compared with the actual geometries for the sake of clearer explanation, these geometries are illustrative only and not intended to limit the interpretation of the present invention. Throughout the description and the drawings, any element that is the same as an element already described in connection with the drawings already referred to is assigned the same reference sign, and detailed description thereof is omitted as appropriate.

Figure 1:
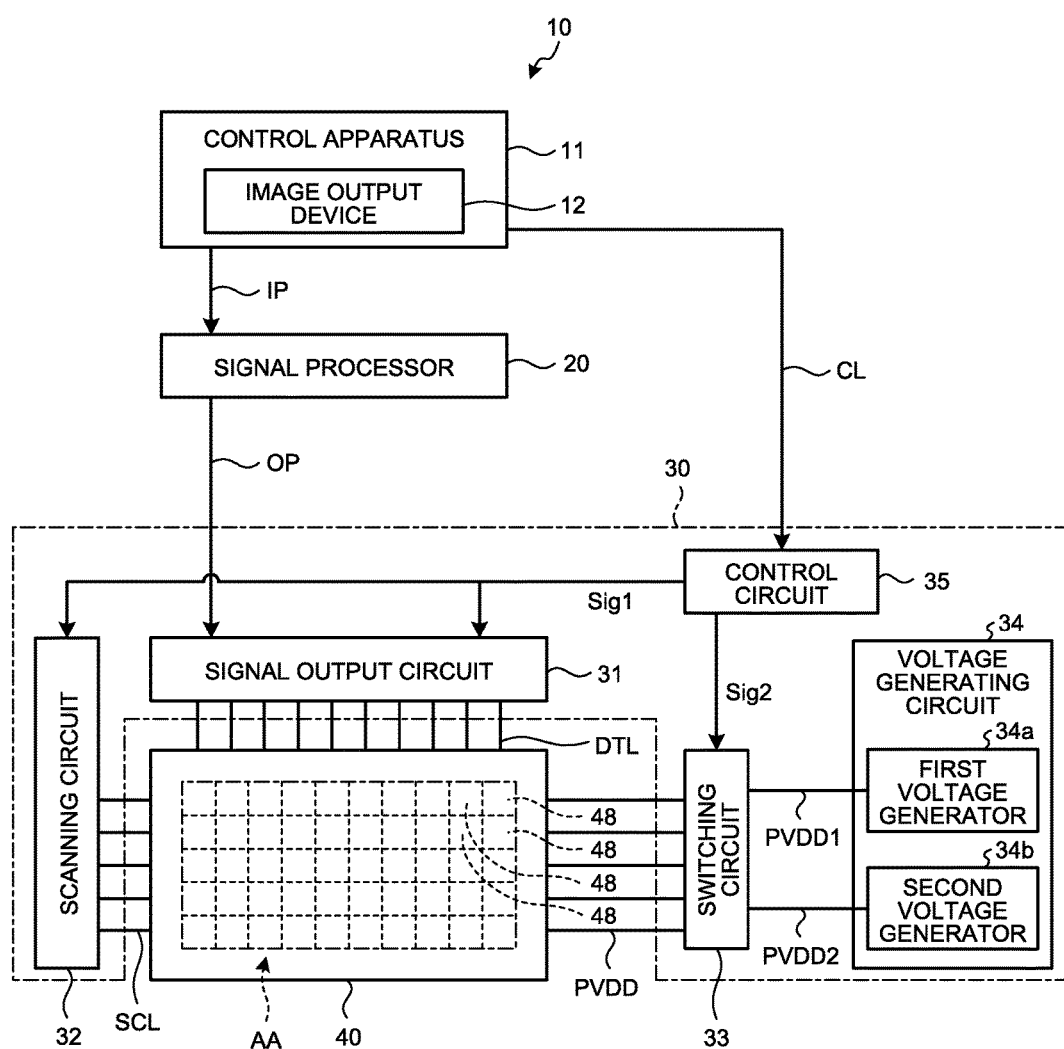
FIG. 1 is a block diagram illustrating an example of the configuration of a display apparatus according to an embodiment of the present invention.

FIG. 1 is a block diagram illustrating an example of the configuration of a display apparatus 10 according to an embodiment of the present invention. As illustrated in FIG. 1, the display apparatus 10 according to the embodiment includes a signal processor 20, an image display panel driving device 30, and an image display panel 40. The signal processor 20 receives input of input signals (RGB data) from an image output device 12 in a control apparatus 11, and transmits signals generated by subjecting the input signals to a certain data conversion process to individual devices in the display apparatus 10. The image display panel driving device 30 controls driving of the image display panel 40 based on signals transmitted from the signal processor 20. The image display panel 40 is a self-emissive image display panel that displays images by, based on signals transmitted from the image display panel driving device 30, lighting up self-emissive elements in sub-pixels 49 (refer to FIG. 2) included in each pixel 48.

Figure 2:
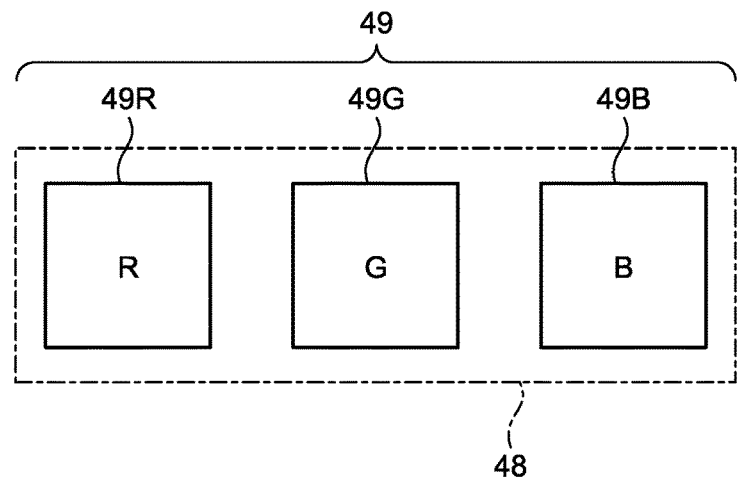
FIG. 2 is a diagram illustrating an array of sub-pixels in an image display panel according to the embodiment.
Figure 3:
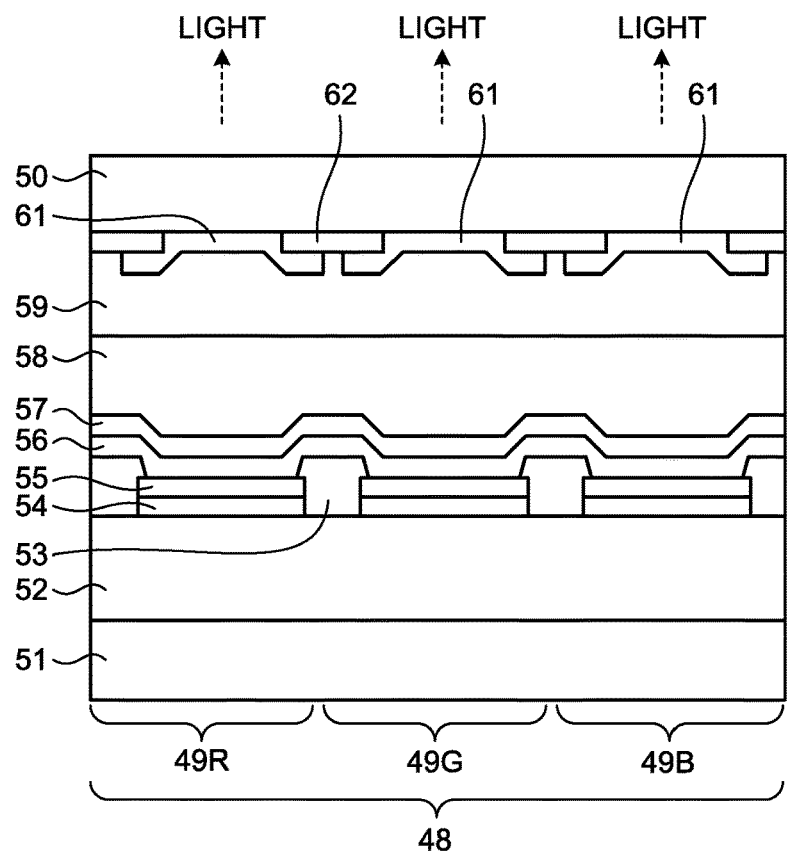
FIG. 3 is a diagram illustrating a sectional structure of the image display panel according to the embodiment.

First, the configuration of the image display panel 40 is described. FIG. 2 is a diagram illustrating an array of sub-pixels in the image display panel 40 according to the embodiment. FIG. 3 is a diagram illustrating a sectional structure of the image display panel 40 according to the embodiment. As illustrated in FIG. 1, the image display panel 40 has the pixels 48, the number of which is $P_0 \times Q_0$ ($P_0$ in the row direction and $Q_0$ in the column direction), in a two-dimensional matrix (row-column configuration). Thus, the image display panel 40 has an active area AA provided as a region on which the pixels 48 are provided and through which display is output.

Each of the pixels 48 includes a plurality of sub-pixels 49. Specifically, the pixel 48 includes a first sub-pixel 49R, a second sub-pixel 49G, and a third sub-pixel 49B, for example, as illustrated in FIG. 2. The first sub-pixel 49R displays, as a first color, a primary red color. The second sub-pixel 49G displays, as a second color, a primary green color. The third sub-pixel 49B displays, as a third color, a primary blue color. However, the first color, the second color, and the third color are not limited to the colors of red, green, and blue, and any colors including complementary colors may be selected as the first to third colors. Hereinafter, when there is no need to distinguish the first sub-pixel 49R, the second sub-pixel 49G, and the third sub-pixel 49B from one another, these sub-pixels are referred to as sub-pixels 49.

As illustrated in FIG. 3, the image display panel 40 includes a substrate 51, insulating layers 52 and 53, a reflecting layer 54, lower electrodes 55, a self-emissive layer 56, an upper electrode 57, insulating layers 58 and 59, color filters 61 serving as a color converting layer, a black matrix 62 serving as a light shielding layer and a substrate 50. The substrate 51 is, for example, a semiconductor substrate of silicon or the like, a glass substrate, or a resin substrate, and has the above-described elements such as the above-described lighting drive circuit formed or mounted thereon. The insulating layer 52 is a protective film that protects the above-described elements such as the above-described lighting drive circuit, and can be formed using a material such as silicon oxide or silicon nitride. The respective lower electrodes 55 are provided for the first sub-pixel 49R, the second sub-pixel 49G, and the third sub-pixel 49B, and are conductive elements serving as anodes (positive electrodes) of organic light emitting diodes EL (refer to FIG. 6) serving as light emitting elements. The lower electrode 55 is a translucent electrode formed of a translucent conductive material (translucent conductive oxide) such as indium tin oxide (ITO). The insulating layer 53 is called a bank and is an insulating layer that defines borders among the first sub-pixel 49R, the second sub-pixel 49G, and the third sub-pixel 49B. The reflecting layer 54 is formed of a material, such as silver, aluminum, or gold, having metallic luster that reflects light emitted from the self-emissive layer 56. The self-emissive layer 56 contains an organic material and includes a hole injection layer, a hole transport layer, an emissive layer, an electron transport layer, and an electron injection layer, which are not illustrated.

As a layer that generates holes, a layer that contains an aromatic amine compound and a substance capable of accepting electrons from the compound is preferably used. An aromatic amine compound is a material having an arylamine skeleton. An aromatic amine compound that contains triphenylamine in the skeleton thereof and has a molecular weight of 400 or higher is particularly preferable. Further among aromatic amine compounds that contain triphenylamine in the skeletons thereof, one that contains a condensed aromatic ring, such as a naphthyl group, in the skeleton thereof is particularly preferable. The heat resistance of the light emitting element is improved by using an aromatic amine compound that contains triphenylamine and a condensed aromatic ring in the skeleton thereof. Examples of the aromatic amine compound include: 4-4'-bis[N-(1-naphthyl)-N-phenylamino]biphenyl (i.e., α-NPD); 4-4'-bis[N-(3-methylphenyl)-N-phenylamino]biphenyl (i.e., TPD); 4,4',4"-tris(N, N-diphenylamino)triphenylamine (i.e., TDATA); 4,4',4"-tris[N-(3-methylphenyl)-N-phenylamino] triphenylamine (i.e., MTDATA); 4-4'-bis[N-{4-(N, N-di-m-tolylamino)phenyl}-N-phenylamino]biphenyl (i.e., DNTPD); 1,3,5-tris[N, N-di(m-tolyl)-animo]benzene (i.e., m-MTDAB); 4,4'4"-tris(N-carbazolyl)triphenylamine (i.e., TCTA); 2-3-bis(4-diphenylaminophenyl)quinoxaline (i.e., TPAQn); 2,2',3,3'-tetrakis(4-diphenylaminophenyl)-6,6'-bisquinoxaline (i.e., D-TriPhAQn); and 2-3-bis{4-[N-(1-naphthyl)-N-phenylamino]phenyl}-dibenzo[f,h]quinoxaline (i.e., NPADiBzQn). The substance capable of accepting electrons from the aromatic amine compound is not particularly limited, and examples thereof include: molybdenum oxide; vanadium oxide; 7,7,8,8-tetracyanoquinodimethane (i.e., TCNQ); and 2,3,5,6-tetrafluoro-7,7,8,8-tetracyanoquinodimethane (i.e., F4-TCNQ).

An electron transport substance is not particularly limited, and examples thereof include: metal complexes such as tris(8-hydroxyquinolinato)aluminum (i.e., Alq3), tris(4-methyl-8-hydroxyquinolinato)aluminum (i.e., Almq3), bis(10-hydroxybenzo[h]quinolinato)beryllium (i.e., BeBq2), bis(2-methyl-8-hydroxyquinolinato)-4-phenylphenolato-aluminum (i.e., BAlq), bis[2-(2-hydroxyphenyl)benzoxazolato]zinc (i.e., Zn(BOX)2), and bis[2-(2-hydroxyphenyl) benzothiazolate]zinc (i.e., Zn(BTZ)2); 2-(4-biphenyl)-5-(4-tert-butylphenyl)-1,3,4-oxydiazole (i.e., PBD); 1,3-bis[5-(p-tert-butylphenyl)-1,3,4-oxydiazole-2-yl]benzene (i.e., OXD-7); 3-(4-tert-butylphenyl)-4-phenyl-5-(4-biphenylyl)-1,2,4-triazole (i.e., TAZ), 3-(4-tert-butylphenyl)-4-(4-ethylphenyl)-5-(4-biphenylyl)-1,2,4-triazole (i.e., p-EtTAZ); bathophenanthroline (i.e., BPhen); and bathocuproin (i.e., BCP). A substance capable of donating electrons to the electron transport substance is not particularly limited, and examples thereof include: alkali metal such as lithium or cesium; alkali earth metal such as magnesium or calcium; and rare earth metal such as erbium or ytterbium. As the substance capable of donating electrons to the electron transport substance, a substance selected from alkali metal oxide and alkali earth metal oxide, such as lithium oxide ($Li_2O$), calcium oxide (CaO), sodium oxide ($Na_2O$), potassium oxide ($K_2O$), and magnesium oxide (MgO) may be used.

For example, reddish light can be obtained by using a substance having an emission spectrum peak at 600 nm to 680 nm, such as: 4-dicyanomethylene-2-isopropyl-6-[2-(1, 1,7,7-tetramethyljulolidine-9-yl)ethenyl]-4H-pyran (i.e., DCJTI); 4-dicyanomethylene-2-methyl-6-[2-(1,1,7,7-tetramethyljulolidine-9-yl)ethenyl]-4H-pyran (i.e., DCJT); 4-dicyanomethylene-2-tert-butyl-6-[2-(1,1,7,7-tetramethyl-julolidine-9-yl)-ethenyl]-4H-pyran (i.e., DCJTB); periflanthene; or 2,5-dicyano-1,4-bis[2-(10-methoxy-1,1,7,7-tetramethyljulolidine-9-yl)ethenyl]benzene. Greenish light can be obtained by using a substance having an emission spectrum peak at 500 nm to 550 nm, such as: N,N'-dimethylquinacridone (i.e., DMQd); coumarin-6; coumarin-545T; or tris(8-hydroxyquinolinato)aluminum (i.e., $Alq_3$). Bluish light can be obtained by using a substance having an emission spectrum peak at 420 nm to 500 nm, such as: 9,10-bis(2-naphthyl)-tert-butylanthracene (i.e., t-BuDNA); 9,9'-bianthryl, 9,10-diphenylanthracene (i.e., DPA); 9,10-bis(2-naphthyl)anthracene (i.e., DNA); bis(2-methyl-8-hydroxyquinolinato)-4-phenylphenolato-gallium (i.e., BGaq); or bis(2-methyl-8-hydroxyquinolinato)-4-phenylphenolato-aluminum (i.e., BAlq). Instead of using a fluorescent substance as described above, a phosphorescent substance may be used as an emissive substance, such as: bis[2-(3,5-bis (trifluoromethyl)phenyl)pyridinato-N,C2']iridium(III)picolinate (i.e., $Ir(CF_3ppy)_2(pic)$); bis[2-(4,6-difluorophenyl) pyridinato-N,C2']iridium(III)acetylacetonate (i.e., FIr (acac)), bis[2-(4,6-difluorophenyl)pyridinato-N,C2']iridium (III)picolinate (i.e., FIr(pic)); or tris(2-phenylpyridinato-N, C2')iridium (i.e., Ir(ppy)3).

The upper electrode 57 is a trancelucent elenctrode formed of a translucent conductive material (translucent conductive oxide) such as indium tin oxide (ITO). This embodiment provides ITO as an example of the translucent conductive material, but is not limited thereto. As the translucent conductive material, a conductive material having a different composition, such as indium zinc oxide (IZO), may be used. The upper electrode 57 serves as the cathode (negative electrode) of the organic light emitting diode EL. The insulating layer 58 is a sealing layer that seals the upper electrode 57 and may be made of silicon oxide, silicon nitride, or the like. The insulating layer 59 is a planarizing layer that evens out level differences attributable to the bank and may be made of silicon oxide, silicon nitride, or the like. The substrate 50 is a translucent substrate that protects the entire image display panel 40 and may be, for example, a glass substrate. While FIG. 3 illustrates an example in which the lower electrode 55 and the upper electrode 57 serve as an anode (positive electrode) and a cathode (negative electrode), respectively, this example is not limiting. The lower electrode 55 and the upper electrode 57 may serve as a cathode and an anode, respectively. In such a case, the polarity of the drive transistor DRT (refer to FIG. 6) electrically coupled to the lower electrode 55 may be changed as appropriate, and the order in which carrier injection layers (the hole injection layer and the electron injection layer), carrier transport layers (the hole transport layer and the electron transport layer), and the emissive layer are stacked on one another may be changed as appropriate.

The image display panel 40 is a color display panel and includes the color filters 61 arranged between the respective sub-pixels 49 and an observer of the images, which are configured so that color components of light emitted by the self-emissive layer 56 that correspond to the colors of the respective sub-pixels 49 may be allowed to pass therethrough. The image display panel 40 is capable of emitting light of colors that correspond to red, green, blue, and white. The image display panel 40 may be configured to emit the respective colors of the first sub-pixel 49R, the second sub-pixel 49G, and the third sub-pixel 49B without causing color components of light emitted by the self-emissive layer 56 to pass through any color converting layer such as the color filters 61.

Figure 4:
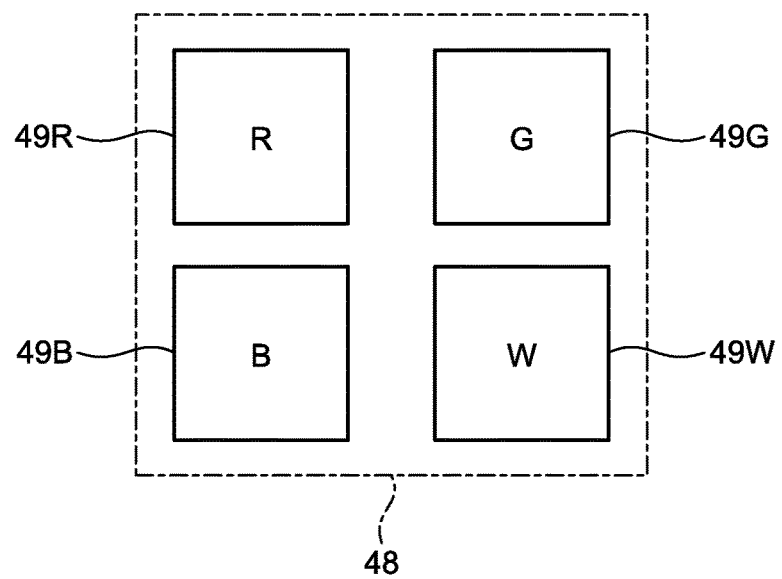
FIG. 4 is a diagram illustrating an alternative array of sub-pixels in the image display panel according to the embodiment.

FIG. 4 is a diagram illustrating an alternative array of the sub-pixels in the image display panel 40 according to the embodiment. The pixel 48 included in the image display panel 40 is not limited to the example described with reference to FIG. 2 that includes the first sub-pixel 49R, the second sub-pixel 49G, and the third sub-pixel 49B. For example, as illustrated in FIG. 4, the pixels 48 each having the sub-pixels 49 in two rows and two columns may be arranged in a matrix (row-column configuration). These sub-pixels 49 are the first sub-pixel 49R, the second sub-pixel 49G, the third sub-pixel 49B, and a fourth sub-pixel 49W. The fourth sub-pixel 49W displays a fourth color (for example, white) that is different from the first color, the second color, and the third color. The image display panel 40 may thus have the sub-pixels 49 in each of the pixels 48 arrayed as desired. The color filter 61 corresponding to white that is otherwise arranged between the fourth sub-pixel 49W and the observer of the images may be excluded or may be replaced by a transparent resin layer. The transparent resin layer thus provided can contribute to preventing formation of a large level difference attributable to the fourth sub-pixel 49W. The number of sub-pixels 49 included in each of the pixels 48 is not limited to 3 or 4 and may be any desired number greater than or equal to 1. The colors of the sub-pixels 49 may be changed as appropriate.

The signal processor 20 generates an output signal OP by processing an input signal IP input thereto from the control apparatus 11. The signal processor 20 converts an input value indicated by the input signal IP (what is called RGB input signal) into and generates the output signal OP that indicates an extended value in a color space, the input value being determined by how red (the first color), green (the second color), and blue (the third color) are combined, the extended value being represented by how the colors of the sub-pixels 49 are combined. The signal processor 20 then outputs the generated output signal OP to the image display panel driving device 30.

The image display panel driving device 30 includes, for example, a signal output circuit 31, a scanning circuit 32, a switching circuit 33, a voltage generating circuit 34, and a control circuit 35. The signal output circuit 31 functions as what is called a source driver, and assigns the output signals OP output from the signal processor 20 to the individual sub-pixels 49, and outputs the output signals OP to the individual sub-pixels 49 through signal lines Vsig. The scanning circuit 32 functions as what is called a gate driver and outputs various signals including a drive signal for driving the sub-pixels 49 row by row.

The switching circuit 33 is enabled to switch voltages so that any desired voltage among a plurality of voltages that the voltage generating circuit 34 generates can be applied to a pixel (for example, the sub-pixels 49 included in the pixel 48).

The voltage generating circuit 34 generates a voltage that generates current that flows into and through the organic light emitting diode EL. Specifically, the voltage generating circuit 34 includes, for example, a first voltage generator 34a and a second voltage generator 34b that generate respective different voltages. The voltage generating circuit 34 according to this embodiment generates a voltage that has a potential higher than the potential of low-potential wiring PVSS (refer to FIG. 6), and supplies the generated voltage to high-potential wiring PVDD. The organic light emitting diode EL lights up with an amount of luminescence according to a current that flows therethrough.

The control circuit 35 controls operation of the signal output circuit 31 and the scanning circuit 32 by outputting signals (synchronization signals Sig1) relating to the operation of the signal output circuit 31 and the scanning circuit 32. The synchronization signals Sig1 include, for example, a clock signal to be input to the signal output circuit 31 and the scanning circuit 32. The clock signal is, for example, output in response to a synchronization signal CL output from the control apparatus 11 so that the control circuit 35 can operate in synchronization with the input signal IP. The control circuit 35 functions as a controller and controls the operation of the switching circuit 33. Specifically, within a period for displaying an image corresponding to one frame, the control circuit 35 causes a switching device to operate at least once so that a voltage that has been applied to a pixel can be switched to another voltage higher than the voltage. The term "pixel" used herein means the sub-pixels 49 included in each pixel 48 insofar as this embodiment concerns. The details of the control circuit 35 are described later.

Figure 5:
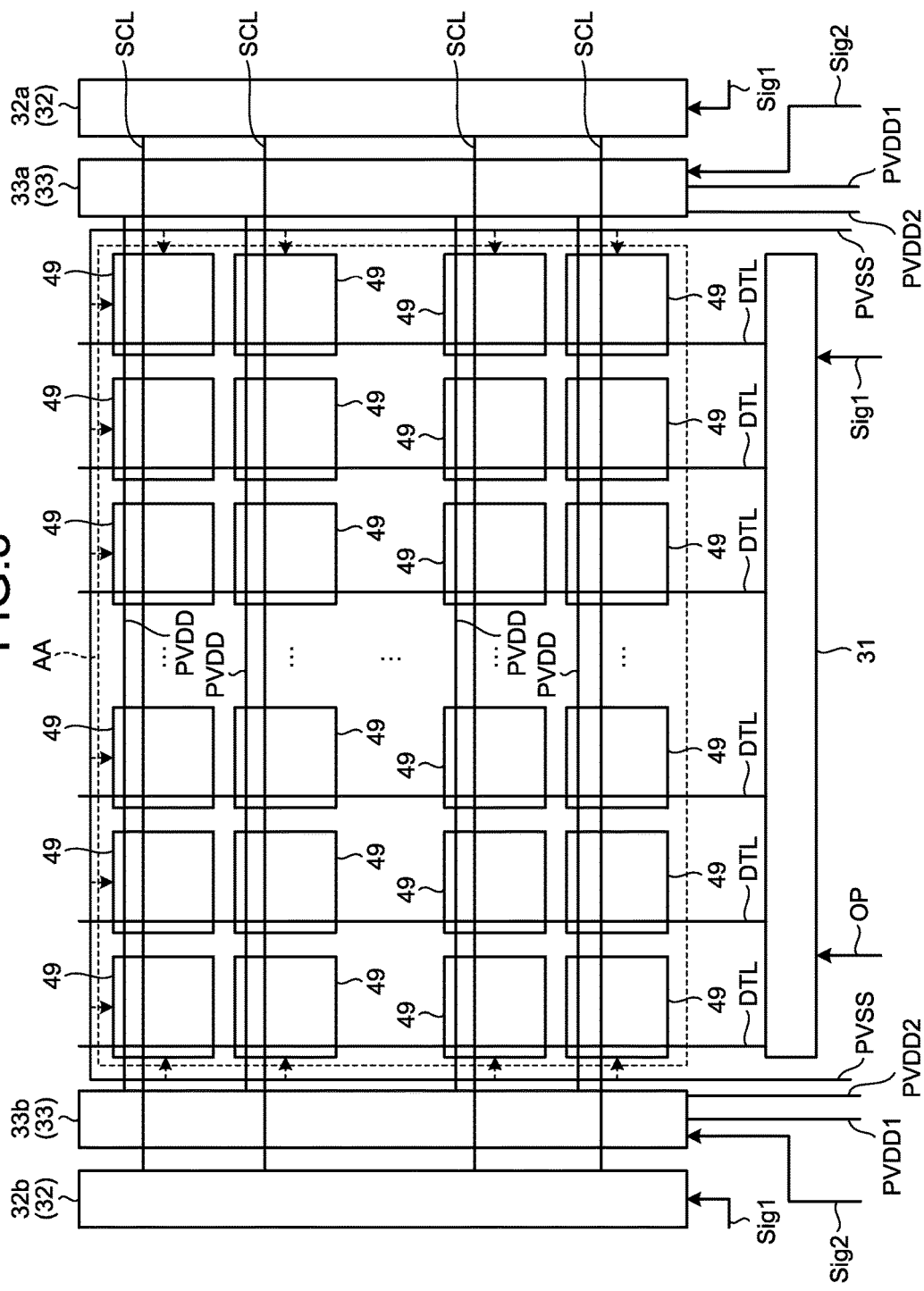
FIG. 5 is a schematic diagram illustrating an example of the coupling relations of components of an image display panel with each sub-pixel.
Figure 6:
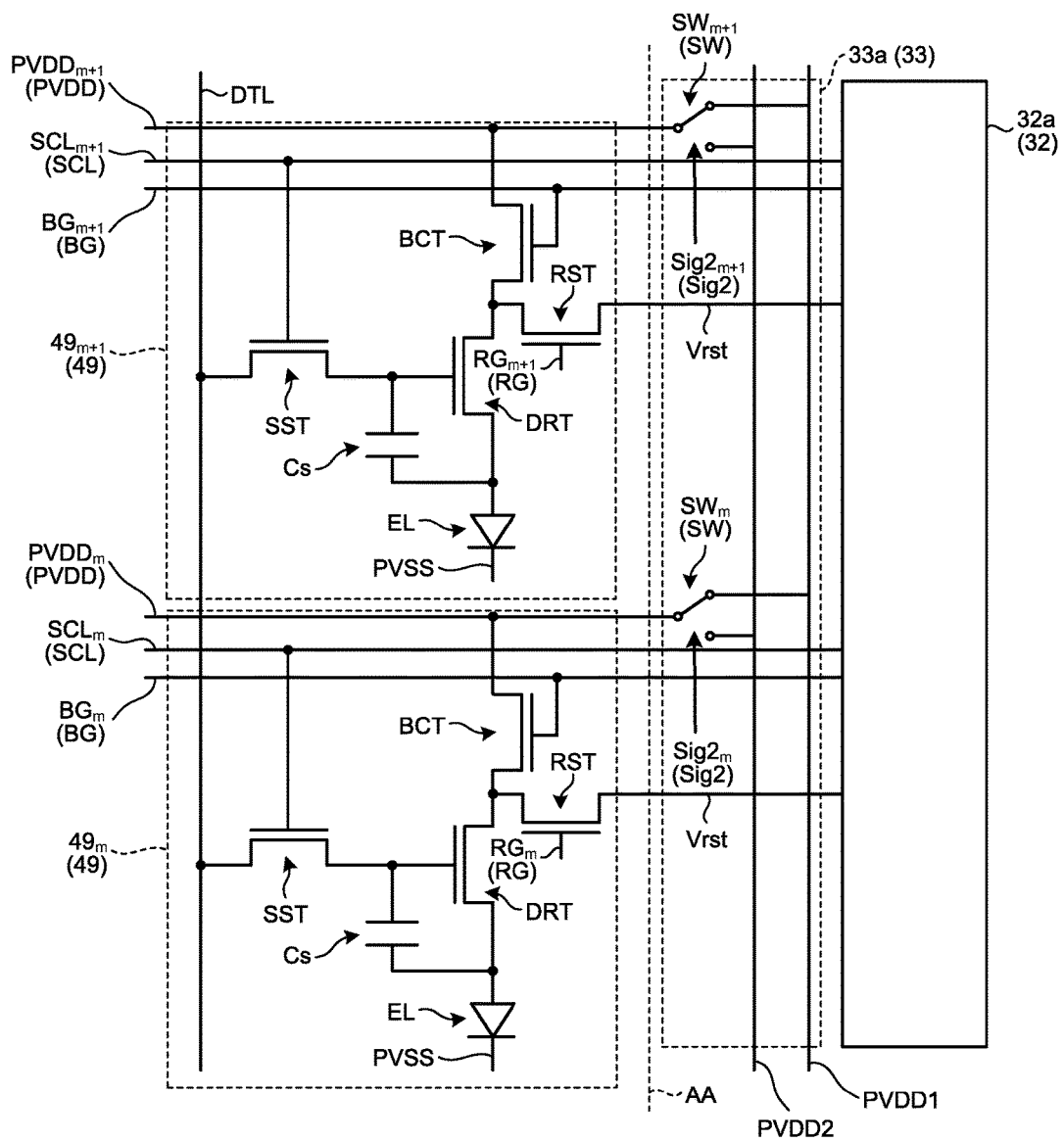
FIG. 6 is a schematic diagram illustrating an example of the coupling relation of a switching circuit with high-potential wiring.

Next, the relation of the image display panel driving device 30 with the sub-pixel 49 is described in more detail. FIG. 5 is a schematic diagram illustrating an example of the coupling relations of components of the image display panel driving device 30 with the sub-pixel 49. FIG. 6 is a schematic diagram illustrating an example of the coupling relation of the switching circuit 33 with the high-potential wiring PVDD. While FIG. 6 illustrates only the sub-pixels $49_m$ and $49_{m+1}$ in two rows and one column, each of the other sub-pixels 49 has the same configuration.

As illustrated in FIG. 1 and FIG. 5, the signal output circuit 31 is coupled to each of the sub-pixels 49 included in the pixel 48 through a signal line DTL. The scanning circuit 32 is also coupled to each of the sub-pixels 49 included in the pixel 48 through a scanning line SCL. The signal line DTL is shared by a plurality of sub-pixels 49 lined up in each column. The scanning line SCL is shared by the sub-pixels 49 lined up in each row. The signal output circuit 31 outputs the output signal to the signal line DTL. The scanning circuit 32 outputs a drive signal to the scanning line SCL.

While FIG. 5 illustrates the scanning circuit 32 that is provided as two scanning circuits 32a and 32b that extend along two opposite sides of the active area AA, the illustration is merely a specific configuration example of the scanning circuit 32, which is not limiting and can be changed as appropriate. While FIG. 5 illustrates the switching circuit 33 provided as two scanning circuits 33a and 33b that extend along two opposite sides of the active area AA, the illustration is merely a specific configuration example of the switching circuit 33, which is not limiting and can be changed as appropriate.

As illustrated in FIG. 6, the sub-pixel 49 includes a control transistor SST, a drive transistor DRT, an electric-charge storing capacitor Cs, and an EL power-supply opening/closing transistor BCT. The gate of the control transistor SST is coupled to the scanning line SCL, the drain thereof is coupled to the signal line DTL, and the source thereof is coupled to the gate of the drive transistor DRT. One end of the electric-charge storing capacitor Cs is coupled to the gate of the drive transistor DRT, and the other end thereof is coupled to the source of the drive transistor DRT. The drain of the drive transistor DRT is coupled to the side of the high-potential wiring PVDD, and the source of the drive transistor DRT is coupled to the anode side of the organic light emitting diode EL, which is a self-emissive layer. The cathode of the organic light emitting diode EL is coupled to, for example, the low-potential wiring PVSS that functions as a reference potential such as a ground.

While FIG. 6 illustrates an example in which an n-channel transistor and a p-channel transistor are used as the control transistor SST and the drive transistor DRT, respectively, the polarities of these transistors are not limited to this example. The polarities of the control transistor SST and the drive transistor DRT may be determined as needed. While FIG. 5 illustrates broken-line arrows drawn from the low-potential wiring PVSS and leading to only the sub-pixels 49 that are adjacent to the low-potential wiring PVSS, the low-potential wiring PVSS actually has an electrode that has a surface part covering the entirety of the active area AA, and all of the sub-pixels 49 are coupled to the low-potential wiring PVSS.

The control transistor SST operates so that a current, according to the output signal OP output to the signal line DTL while the drive signal is being output to the scanning line SCL, can flow into the electric-charge storing capacitor Cs. The electric-charge storing capacitor Cs stores electric charge according to the output signal, and determines a current that flows between the source and the drain of the drive transistor DRT. Between the source and the drain of the drive transistor DRT, a voltage according to the difference in potential between the high-potential wiring PVDD and the low-potential wiring PVSS is generated. In this state, when the drive transistor DRT operates in accordance with the electric charge stored in the electric-charge storing capacitor Cs, a current based on this voltage flows into the organic light emitting diode EL. That is, the drive transistor DRT is provided on a path through which a current according to a voltage due to the difference in potential between the high-potential wiring PVDD and the low-potential wiring PVSS flows into a light emitting element (for example, the organic light emitting diode EL). The drive transistor DRT functions so as to set a current that flows into the light emitting element to a current according to electric charge stored in the electric-charge storing capacitor Cs. Thus, a current according to the output signal is allowed to flow into the organic light emitting diode EL.

Between the high-potential wiring PVDD and the low-potential wiring PVSS, the EL power-supply opening/closing transistor BCT is provided to the drain side of the drive transistor DRT. The gate of the EL power-supply opening/closing transistor BCT is coupled to the EL power-supply opening/closing signal line BG, the drain thereof is coupled to the high-potential wiring PVDD, and the source thereof is coupled to the drain side of the drive transistor DRT, which is provided to the low-potential wiring PVSS side. The EL power-supply opening/closing transistor BCT operates in accordance with switching of a signal output to the EL power-supply opening/closing signal line BG, thereby generating an output that corresponds to a voltage between the source and the drain thereof. A resetting line Vrst for resetting the output from the sub-pixel 49 is coupled to a part between the EL power-supply opening/closing transistor BCT and the drive transistor DRT. The potential of the resetting line Vrst functions as a resetting signal for making, in an offset cancellation operation, a potential between the EL power-supply opening/closing transistor BCT and the drive transistor DRT less than the potential of PVSS. A resetting transistor RST is provided to the resetting line Vrst. The gate of the resetting transistor RST is coupled to a resetting signal line RG, and the source and the drain thereof are provided halfway through the resetting line Vrst. The scanning circuit 32 outputs the resetting signal to the resetting line Vrst prior to update of a frame image to reset the electric charge stored in the electric-charge storing capacitor Cs and the light emission status of the organic light emitting diode EL. Thereafter, the signal output circuit 31 outputs the output signal to the signal line DTL in accordance with the time when the scanning circuit 32 again outputs the drive signal to the scanning line SCL.

Next, switching of potentials in the high-potential wiring PVDD is described. The switching circuit 33 includes a switch SW that couples any one selected from among a plurality of high-potential lines (for example, a first high-potential line PVDD1 and a second high-potential line PVDD2) to the high-potential wiring PVDD. The switch SW operates in accordance with a control signal Sig2 from the control circuit 35 functioning as a controller, and switches high-potential lines coupled to the high-potential wiring PVDD.

Figure 7:
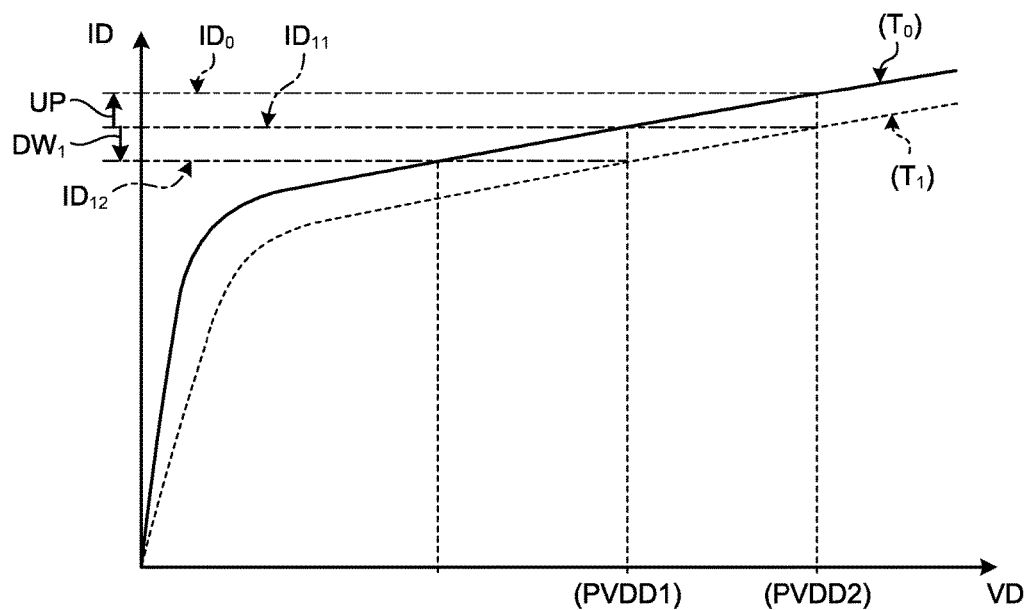
FIG. 7 is a graph illustrating an example of the relations of the potentials of a first high-potential line and a second high-potential line with current flowing through a drive transistor.

FIG. 7 is a graph illustrating an example of the relations among drain currents (ID) flowing through the drive transistor DRT, drain voltages (VD), and the potentials of the first high-potential line PVDD1 and the second high-potential line PVDD2, which determine the gate-source voltage in the drive transistor DRT. Because a higher drain voltage (VD) corresponds to a larger drain current (ID), a larger drain current (ID) flows through the drive transistor DRT when the second high-potential line PVDD2 is coupled than when the first high-potential line PVDD1 is coupled. The first high-potential line PVDD1 and the second high-potential line PVDD2 have different potentials by being coupled to the first voltage generator 34a and the second voltage generator 34b, respectively, that generate respective different voltages. In this embodiment, the second voltage generator 34b outputs a higher voltage than the first voltage generator 34a.

At a time point immediately after electric charge is stored in accordance with the output signal, the switch SW in the switching circuit 33 couples the first high-potential line PVDD1 having a lower voltage to the high-potential wiring PVDD. At that time point, the electric-charge storing capacitor Cs already has stored sufficient electric charge according to the output signal stored therein, and has generated a voltage that allows the drive transistor DRT to flow the current in accordance with the output signal. However, the electric charge stored in the electric-charge storing capacitor Cs is gradually lost as a result of electric leak over time after that time point, and the current flowing between the source and the drain of the drive transistor DRT gradually decreases. Therefore, on the assumption that the potentials of the high-potential wiring PVDD and the low-potential wiring PVSS are constant, a current that flows between the high-potential wiring PVDD and the low-potential wiring PVSS, which determines the amount of luminescence of the organic light emitting diode EL, gradually decreases during a period from the update timing $T_0$ of the frame image to the update timing $T_2$ of the next frame image as the electric charge of the electric-charge storing capacitor Cs is gradually lost. Under the assumed conditions, the luminance of the organic light emitting diode EL continues decreasing during the period from the update timing $T_0$ of the frame image to the update timing $T_2$ of the next frame image.

Hence, in this embodiment, the control circuit 35 is configured to output, during the period from the update timing $T_0$ of the frame image to the update timing $T_2$ of the next frame image, the control signal Sig2 to cause the switch SW to operate so as to switch high-potential lines coupled to the high-potential wiring PVDD to the second high-potential line PVDD2 that has a higher potential. This configuration can enlarge the difference in potential between the high-potential wiring PVDD and the low-potential wiring PVSS and thus increase a current that flows between the high-potential wiring PVDD and the low-potential wiring PVSS.

In the example illustrated in FIG. 7, under the assumption that the second high-potential line PVDD2 has been coupled to the high-potential wiring PVDD at the update timing $T_0$ of the frame image, a current flowing through the organic light emitting diode EL being the current being larger by a current increase UP than in a case in which the first high-potential line PVDD1 has been coupled to the high-potential wiring PVDD after the update timing $T_0$ of the frame image. In this embodiment, a decrease in electric charge (what is called "leak") in the electric-charge storing capacitor Cs that occurs between the update timing $T_0$ of the frame image and a timing $T_1$ can result in a decrease in current that flows into the drive transistor DRT. Here, a timing $T_1$ is a midpoint between the update timing $T_0$ and the update timing $T_2$ of the next frame image, and the decrease in current being equal to the drain current UP. The value of a drain current $ID_{11}$ of the update timing $T_0$ of the frame image decreases to the value $ID_{12}$ at the timing $T_1$ as the electric charge stored in the electric-charge storing capacitor Cs is gradually lost. At the timing $T_1$, the high-potential wiring PVDD is switched to the second high-potential line PVDD2 instead of the first high-potential line PVDD1, and accordingly, the current flowing through the drive transistor DRT increases by the drain current $DW_1$ (substantially same as the drain current UP). As a result, the value of the current decreased at the timing $T_1$ flowing through the drive transistor DRT gets back to the current value which is the same as that of the timing $T_0$. A power-supply voltage generated by the first voltage generator 34a and a power supply voltage generated by the second voltage generator are set such that the drain current of the drain transistor DRT at the timing $T_0$, when supplied from the first voltage generator 34a, is substantially same as the drain current of the drain transistor DRT at the timing $T_1$ when supplied from the second voltage generator 34b. A channel-length modulation effect occurs and shortens the substantial length of a channel of the drive transistor DRT, resulting in an increase in drain current (ID), if the difference in potential between the high-potential wiring PVDD and the low-potential wiring PVSS is increased as the voltage of the high-potential wiring PVDD is heightened through a process such as switching high-potential lines from the first high-potential line PVDD1 to the second high-potential line PVDD2.

Figure 8:
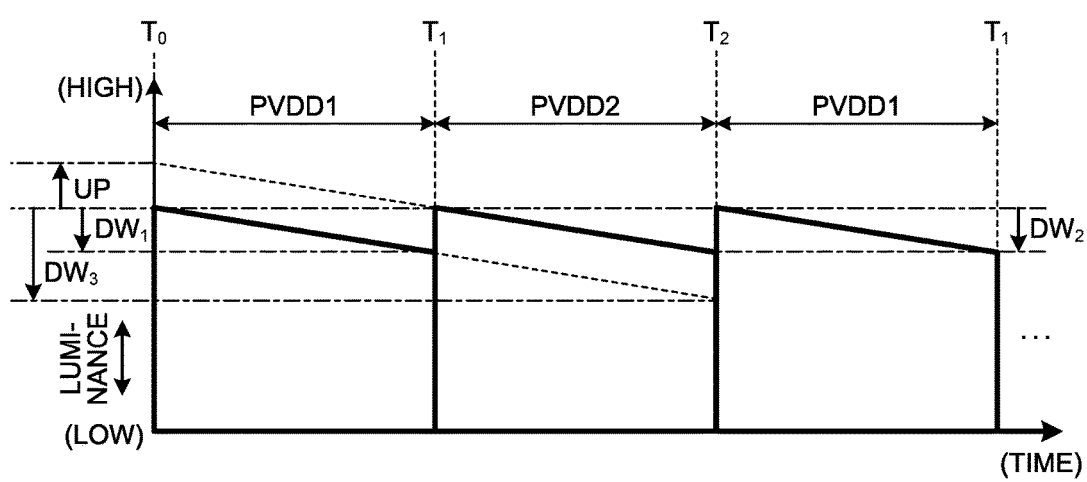
FIG. 8 is a graph illustrating an example of the relation between the elapsed time starting from an update timing when a frame image is updated and the luminance of an organic light emitting diode.

FIG. 8 is a graph illustrating an example of the relation between the elapsed time starting from the update timing $T_0$ of the frame image and the luminance of the organic light emitting diode EL. In this embodiment, the control circuit 35 sets, at the update timing $T_0$ of the frame image, the first high-potential line PVDD1 as a high-potential line coupled to the high-potential wiring PVDD. The control circuit 35 sets, at a time (for example, at the timing $T_1$) when a certain time period elapses after the update timing $T_0$ of the frame image, the second high-potential line PVDD2 as a high-potential line coupled to the high-potential wiring PVDD. Thus, as illustrated in FIG. 7, a current that flows through the organic light emitting diode EL at the timing $T_1$ can be made equal to a current that flows in response to the voltage between the first high-potential line PVDD1 and the low-potential wiring PVSS at the update timing $T_0$ of the frame image. Therefore, as illustrated in FIG. 8, the decrease in luminance of the organic light emitting diode EL that occurs during the period from the update timing $T_0$ of the frame image to an update timing $T_2$ of the next frame image can be reduced to $DW_1$ and $DW_2$.

Figure 9:
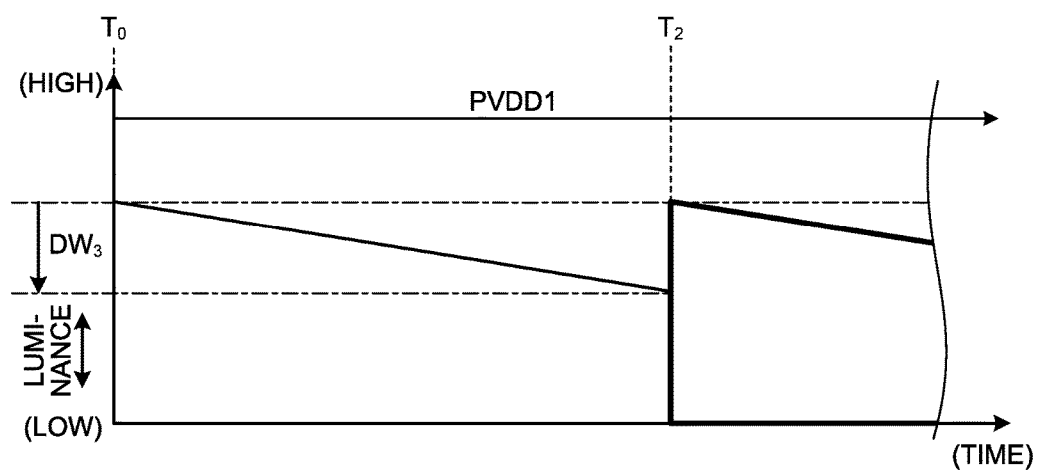
FIG. 9 is a graph illustrating a comparative example of the relation between the elapsed time starting from when a frame image is updated and the luminance of an organic light emitting diode.

FIG. 9 is a graph illustrating a comparative example of the relation between the elapsed time starting from the update timing $T_0$ of the frame image and the luminance of the organic light emitting diode EL. Under the assumption that a potential coupled to the high-potential wiring PVDD is a constant potential (for example, a potential that the first high-potential line PVDD1 has) during the time period from the update timing $T_0$ of the frame image to the update timing $T_2$ of the next frame image, the luminance of the organic light emitting diode EL incessantly decreases starting from the update timing $T_0$ of the frame image, as illustrated in FIG. 9. The decrease in luminance of the organic light emitting diode EL that occurs during the period from the update timing $T_0$ of the frame image to the update timing $T_2$ of the next frame image is $DW_3$, which is larger than $DW_1$ and $DW_2$. An extreme change in luminance of the organic light emitting diode EL that accompanies update of a frame may be visually recognized as a flicker on the image display panel 40. This explains that flickers are more likely to be visually recognized in the example illustrated in FIG. 9 than in the example illustrated in FIG. 8. In consideration of this disadvantage, this embodiment employs a technique of switching high-potential lines each selectable as one coupled to the high-potential wiring PVDD, thereby enabling flickers to be prevented from occurring.

A display device according to this embodiment is configured to be switchable between a high refresh rate mode and a low refresh rate mode. In the high refresh rate mode, a period for displaying an image corresponding to one frame is relatively short. In the low refresh rate mode, a period for displaying an image corresponding to one frame is relatively long. Specifically, the high refresh rate mode is an operation mode (60 Hz) in which output contents displayed on the image display panel 40 is updated 60 times per second. The low refresh rate mode is an operation mode (30 Hz) in which output contents displayed on the image display panel 40 is updated 30 times per second.

The control circuit 35 according to this embodiment causes the switching device to operate in the low refresh rate mode. Specifically, the control circuit 35 sets, at the update timing $T_0$ of the frame image, the first high-potential line PVDD1 as a high-potential line coupled to the high-potential wiring PVDD. The control circuit 35 sets, at the timing $T_1$ after the update timing $T_0$ of the frame image, the second high-potential line PVDD2 as a high-potential line coupled to the high-potential wiring PVDD. Thus, as illustrated in FIG. 8, the decrease in luminance of the organic light emitting diode EL that occurs during the period from the update timing $T_0$ of the frame image to an update timing $T_2$ of the next frame image can be reduced to $DW_1$ and $DW_2$. In contrast, in the high refresh rate mode, the control circuit 35 according to this embodiment sets the first high-potential line PVDD1 as a high-potential line coupled to the high-potential wiring PVDD and does not switch the high-potential lines to the second high-potential line PVDD2. This is because, in the high refresh rate mode, a frame image is updated at the timing $T_1$, resulting in a decrease of only $DW_1$ in luminance of the organic light emitting diode EL after update of a preceding frame image.

In this embodiment, a time period from the update timing $T_0$ of a frame image to the update timing $T_2$ of the next frame image corresponds to a period for displaying one frame image at 30 Hz. A time period from the update timing $T_0$ of a frame image to the timing $T_1$ corresponds to a period for displaying one frame image at 60 Hz.

The timing when high-potential lines coupled to the high-potential wiring PVDD are switched may be determined to be as desired. The control circuit 35 in this embodiment sets the first high-potential line PVDD1 as a high-potential line coupled to the high-potential wiring PVDD, row by row synchronously with outputting of a drive signal to the scanning line SCL, which is performed by the scanning circuit 32 row by row. The control circuit 35 sets, at a time (for example, at the timing $T_1$) when a certain time period elapses after that timing, the second high-potential line PVDD2 as a high-potential line coupled to the high-potential wiring PVDD. Thus, switching high-potential lines coupled to the high-potential wiring PVDD can be synchronized with transmission of an output signal to the sub-pixels 49, which is performed row by row.

Figure 10:
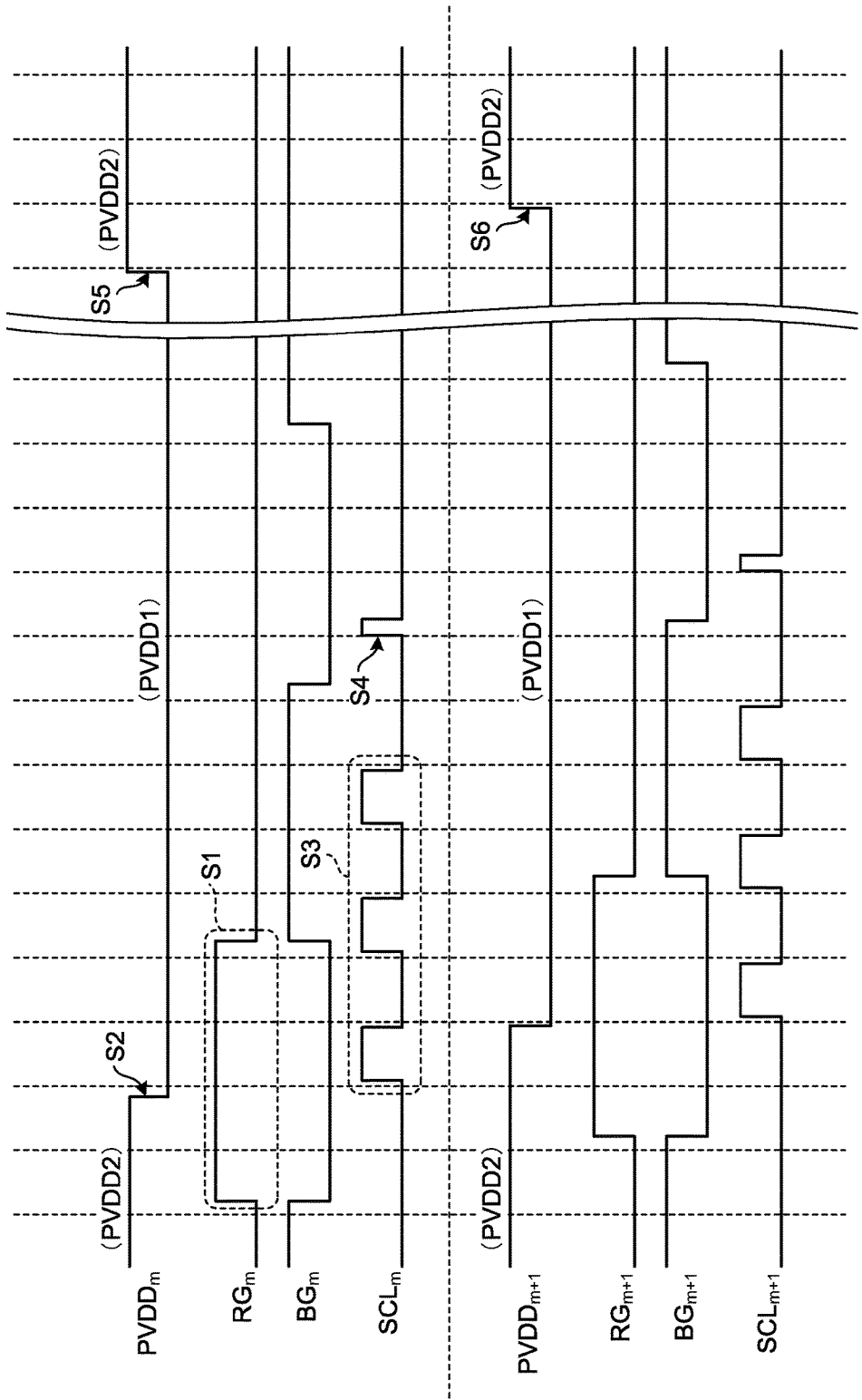
FIG. 10 is a timing chart illustrating an example of switching high-potential lines.

FIG. 10 is a timing chart illustrating an example of switching high-potential lines. In this embodiment, for example, synchronously with resetting and reloading the electric-charge storing capacitor Cs of the sub-pixel $49_m$ illustrated in FIG. 6, the control circuit 35 outputs the control signal $Sig2_m$ to the switch $SW_m$ to set the first high-potential line PVDD1 as a high-potential line coupled to the high-potential wiring PVDD for the sub-pixel $49_m$. Specifically, a signal output to the resetting signal line $RG_m$ is turned high, and wiring between the EL power-supply opening/closing transistor BCT and the organic light emitting diode EL of the sub-pixel $49_m$ is reset with the voltage of the resetting signal (S1 in FIG. 10). During this resetting, a signal output to the EL power-supply opening/closing signal line $BG_m$ is low, and the source and the drain of the EL power-supply opening/closing transistor BCT are disconnected from each other. During this resetting, high-potential lines coupled to the high-potential wiring PVDD for the sub-pixel $49_m$ are switched from the second high-potential line PVDD2 so far coupled for outputting a previous frame image to the first high-potential line PVDD1 (S2 in FIG. 10). After the high-potential lines are switched, a drive signal is output to the scanning line $SCL_m$ in response to outputting of a resetting potential (S3 in FIG. 10) for resetting the electric-charge storing capacitor Cs and an output signal (S4 in FIG. 10) for outputting display of an image. This causes the electric-charge storing capacitor Cs to store electric charge therein. A period indicated by S3 in FIG. 10 is an offset cancellation period for the sub-pixel $49_m$. Switching high-potential lines coupled to the high-potential wiring PVDD from the second high-potential line PVDD2 to the first high-potential line PVDD1 is performed before the start of the offset cancellation period.

In the same manner as the above control on when to output signals for the operation of the sub-pixel $49_m$, synchronously with resetting and reloading the electric-charge storing capacitor Cs of the sub-pixel $49_{m+1}$, the control circuit 35 outputs the control signal $Sig2_{m+1}$ to the switch $SW_{m+1}$ to set the first high-potential line PVDD1 as a high-potential line coupled to the high-potential wiring PVDD for the sub-pixel $49_{m+1}$. In the case of this embodiment, displayed output contents are updated row by row. Thus, there is a time lag of a certain period (for example, a one-clock period) between the start of outputting the signals for the operation of the sub-pixel $49_m$ and the start of outputting the signals for the operation of the sub-pixel $49_{m+1}$. When a time period from the update timing $T_0$ of the frame image to the timing $T_1$ elapses, the control circuit 35 outputs the control signal $Sig2_m$ to the switch $SW_m$ to set the second high-potential line PVDD2 as a high-potential line coupled to the high-potential wiring PVDD for the sub-pixel $49_m$ (S5 in FIG. 10). After the elapse of the certain period, the control circuit 35 outputs the control signal $Sig2_{m+1}$ to the switch $SW_{m+1}$ to set the second high-potential line PVDD2 as a high-potential line coupled to the high-potential wiring PVDD for the sub-pixel $49_{m+1}$ (S6 in FIG. 10). That is, in this embodiment, with respect to each of all of the sub-pixels 49, high-potential lines coupled to the high-potential wiring PVDD are switched to the second high-potential line PVDD2 after completion of update of a frame image.

Figure 11:
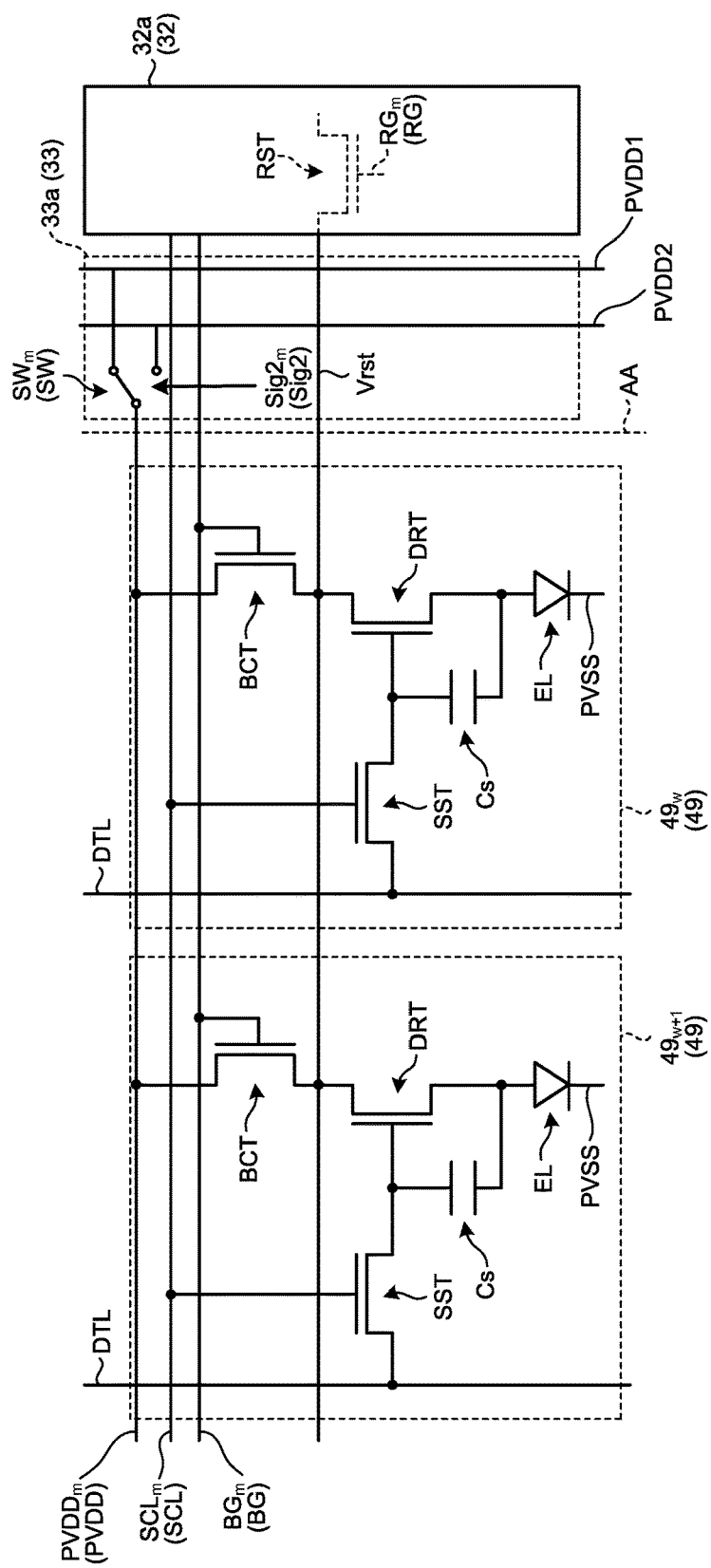
FIG. 11 is a diagram illustrating a configuration example of a case having a resetting transistor shared by a plurality of sub-pixels lined up in each row.
Figure 14:
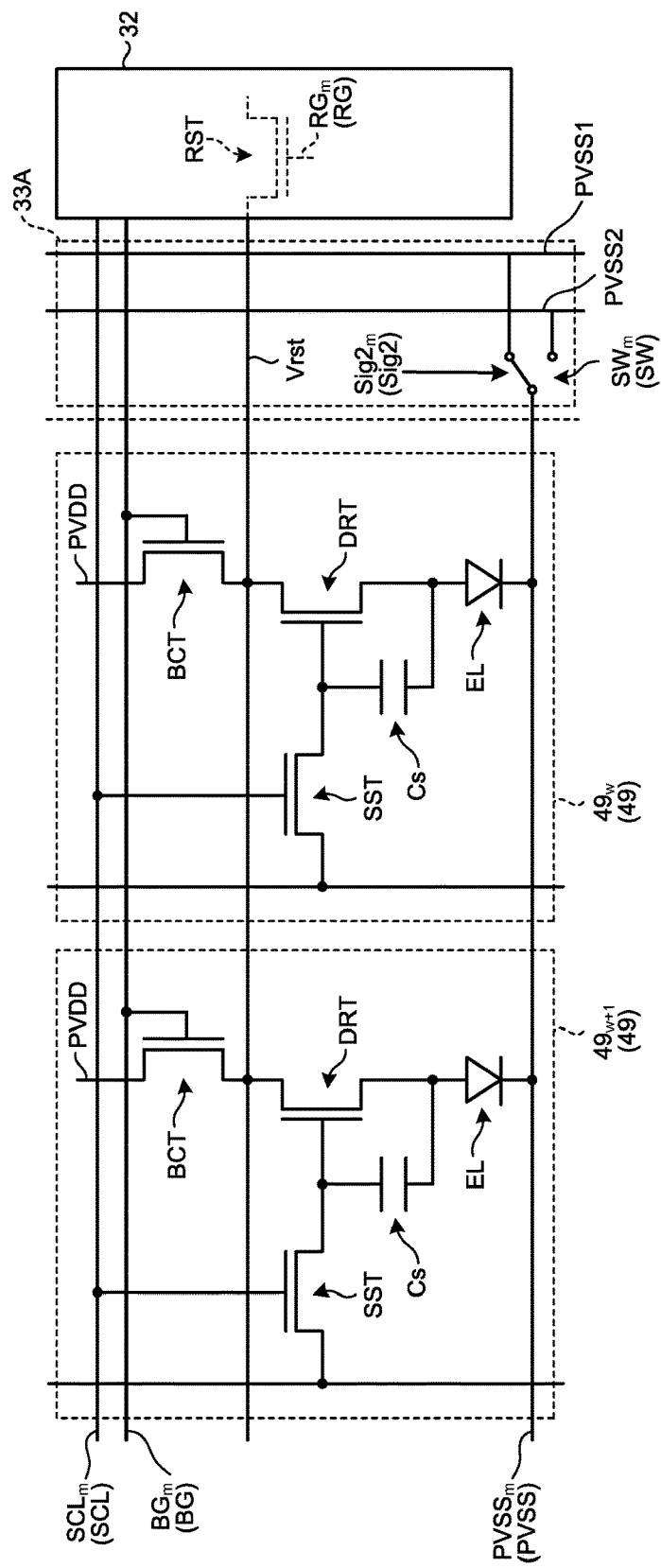
FIG. 14 is a diagram illustrating a configuration example of a case having a resetting transistor shared by a plurality of sub-pixels lined up in each row in the modification.

FIG. 11 is a diagram illustrating a configuration example of a case having the resetting transistor RST shared by a plurality of sub-pixels 49 lined up in each row. FIG. 6 illustrates an example having the resetting transistor RST provided in the sub-pixel 49. However, because the resetting transistors RST operate at timings common to a plurality of pixels lined up in each row, the resetting transistor RST may be shared by the pixels lined up in each row. Specifically, the pixels lined up in each row may be coupled to the resetting line Vrst that is shared by the pixels lined up in each row, for example, as illustrated in FIG. 11 and FIG. 14, which is described later. In such a case, a resetting transistor RST that switches that resetting line Vrst between outputting and not outputting a resetting signal is shared by a plurality of pixels lined up in that row. The resetting transistor RST in that case may be provided in the scanning circuit 32, for example, as illustrated in FIG. 11 and FIG. 14 or may be provided outside the scanning circuit 32. While FIG. 11 and FIG. 14 illustrates the sub-pixels $49_w$ and $49_{w+1}$ in one row and two columns, the sub-pixels 49 lined up in the same row can similarly share the resetting line Vrst. While FIG. 11 and FIG. 14 illustrate the row that corresponds to the resetting signal line $RG_m$, a plurality of sub-pixels 49 lined up in each of the other rows that correspond to the other resetting signals lines such as the resetting signal line $RG_{m+1}$ can similarly share a corresponding one of the resetting lines Vrst.

As described above, this embodiment allows voltages applied to the sub-pixel 49 included in the pixel 48 to be switched within a period for displaying an image corresponding to one frame, and thus can reduce a decrease in luminance of the sub-pixel 49 that occurs during a period for displaying an image corresponding to one frame. This embodiment therefore can prevent flickers from occurring because of differences in luminance over a period from before to after the update.

As a result of switching the high potential side, a decrease in luminance of the sub-pixel 49 that occurs during a period for displaying an image corresponding to one frame can be reduced with the coupling status of the low-potential side kept unchanged.

As a result of causing the switching device to operate in the low refresh rate mode, flickers can be more effectively prevented from occurring during the low refresh rate mode that has a longer period for displaying one frame image and has a decrease in luminance of the sub-pixel 49 sharper, and is more likely to have flickers visibly present than the high refresh rate mode.

Modification

The following describes a modification of the embodiment according to the present invention. In describing the modification, the same reference signs are assigned to the same components as those in the embodiment, and descriptions thereof may be omitted.

Figure 12:
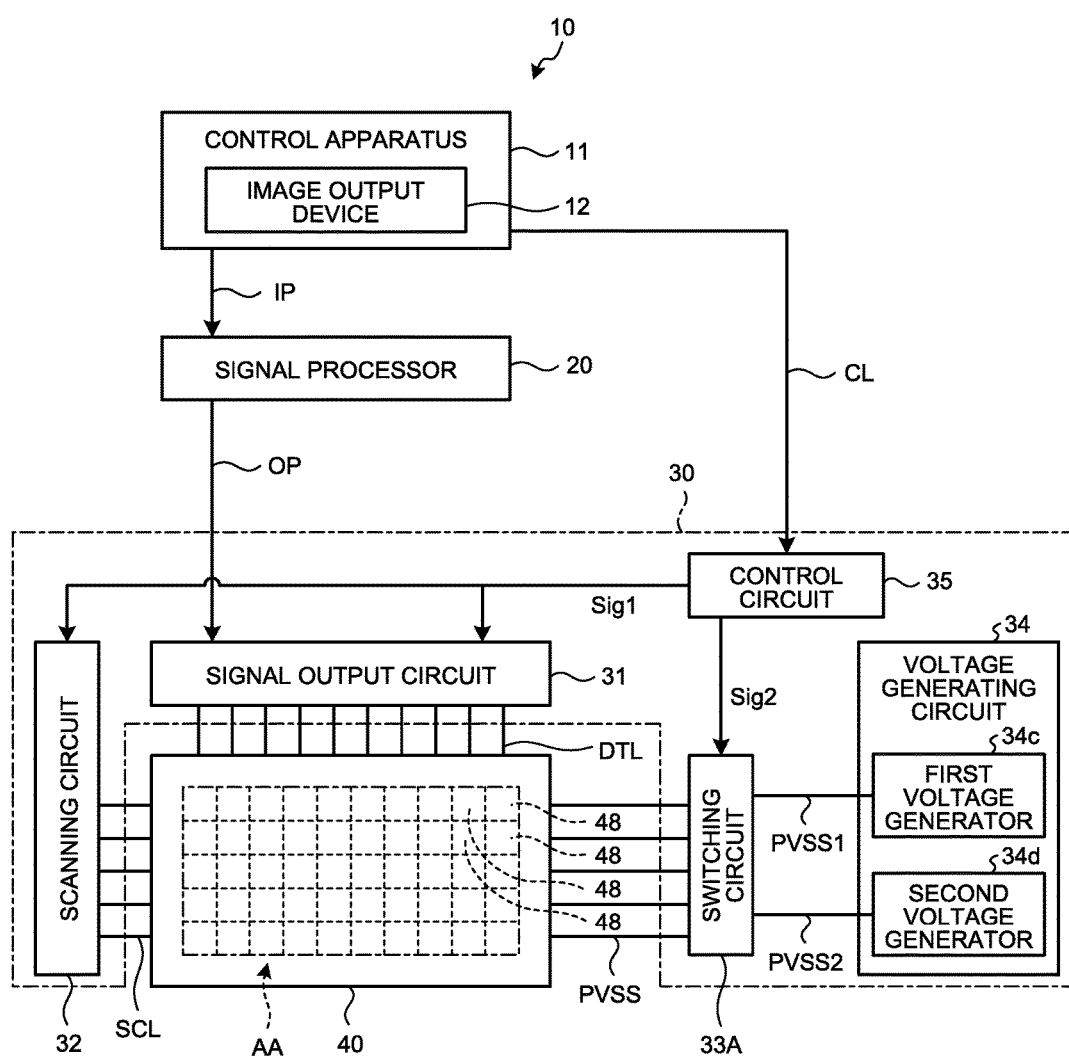
FIG. 12 is a block diagram illustrating an example of the configuration of a display apparatus according to a modification.
Figure 13:
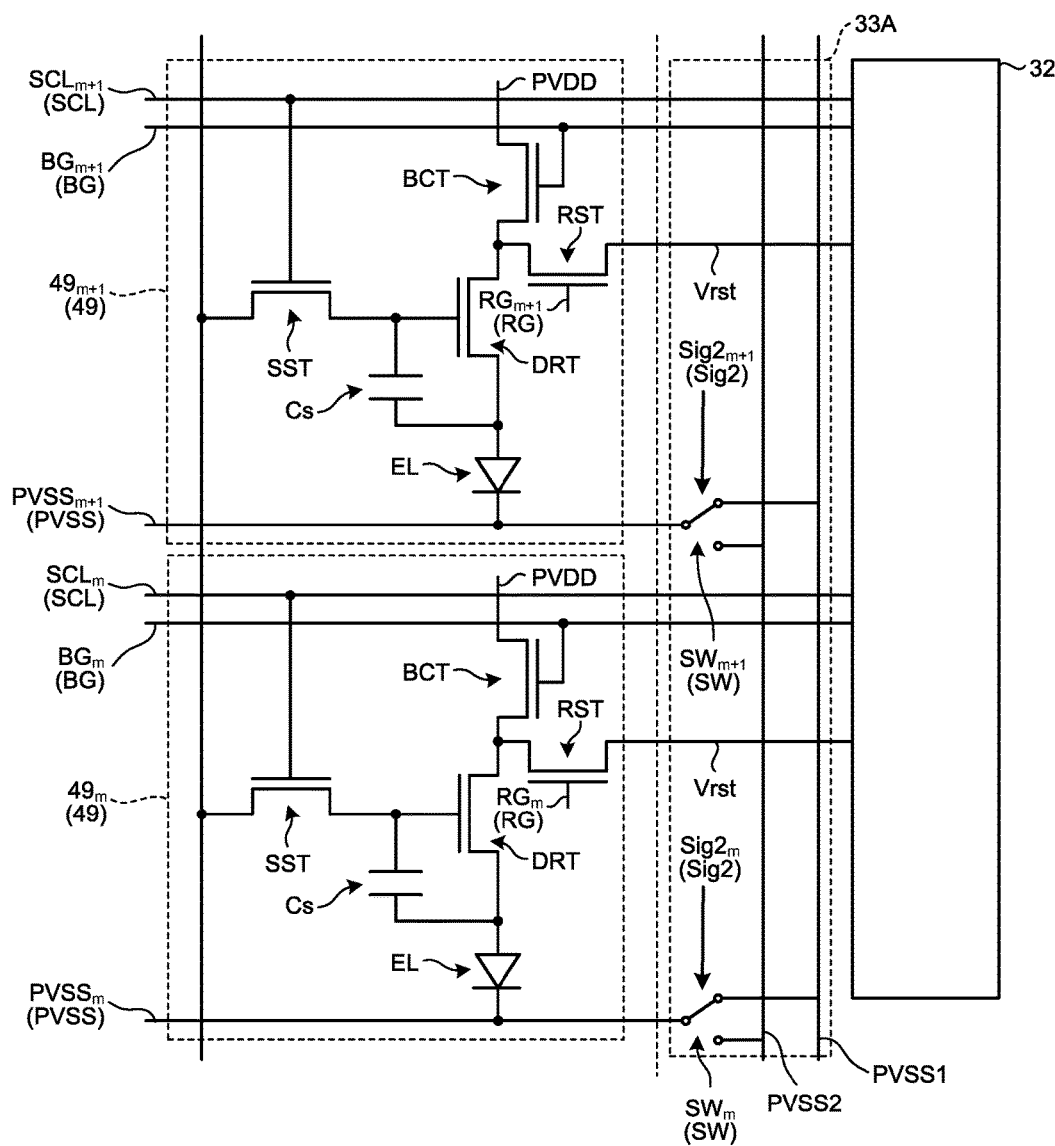
FIG. 13 is a schematic diagram illustrating an example of the coupling relation of a switching circuit with low-potential wiring in the modification.

FIG. 12 is a block diagram illustrating an example of the configuration of the display apparatus 10 according to the modification. FIG. 13 is a schematic diagram illustrating an example of the coupling relation of the switching circuit 33 with the low-potential wiring PVSS in the modification. FIG. 14 is a diagram illustrating a configuration example of a case having a resetting transistor RST shared by a plurality of sub-pixels 49 lined up in each row in the modification. In the modification, as illustrated in FIG. 12, a first voltage generator 34c and a second voltage generator 34d are provided. The voltage generating circuit 34 according to the modification generates a voltage that has a potential lower than the potential of high-potential wiring PVDD, and supplies the generated voltage to low-potential wiring PVSS. In the modification, the high-potential wiring PVDD is kept at a constant high potential, and is constructed using the same mechanism as the low-potential wiring PVSS in the embodiment. In the modification, a switching circuit 33A is provided in place of the switching circuit 33 provided in the embodiment. The switching circuit 33A includes a switch SW that couples any one selected from among a plurality of low-potential lines (for example, a first low-potential line PVSS1 and a second low-potential line PVSS2) to the low-potential wiring PVSS. The first low-potential line PVSS1 and the second low-potential line PVSS2 have different potentials by being coupled to the first voltage generator 34c and the second voltage generator 34d, respectively, that generate respective different voltages. In this modification, the second voltage generator 34d outputs a lower voltage than the first voltage generator 34c.

The switching circuit 33A in the modification has the same configuration as the switching circuit 33 in the embodiment except that, instead of the high-potential wiring PVDD, the low-potential wiring PVSS is switched. That is, in the modification, the control circuit 35 outputs the control signal Sig2 during the period from the update timing $T_0$ of the frame image to the update timing $T_2$ of the next frame image to cause the switch SW to operate so as to switch low-potential lines coupled to the low-potential wiring PVSS from the first low-potential line PVSS1 that has a higher potential to the second low-potential line PVSS2 that has a lower potential. This configuration can enlarge the difference in potential between the high-potential wiring PVDD and the low-potential wiring PVSS, thus increase a current that flows between the high-potential wiring PVDD and the low-potential wiring PVSS, and achieve the same pattern of changes in luminance as that illustrated in FIG. 8.

Specifically, for example, synchronously with resetting and reloading the electric-charge storing capacitor Cs of the sub-pixel $49_m$ illustrated in FIG. 13 and FIG. 14, the control circuit 35 outputs the control signal $Sig2_m$ to the switch $SW_m$ to set the first low-potential line PVSS1 as a low-potential line coupled to the low-potential wiring PVSS for the sub-pixel $49_m$. Thereafter, when a time period from the update timing $T_0$ of the frame image to the timing $T_1$ in FIG. 8 elapses, the control circuit 35 outputs the control signal $Sig2_m$ to the switch $SW_m$ to set the second low-potential line PVSS2 as a low-potential line coupled to the low-potential wiring PVSS for the sub-pixel $49_m$. In the same manner, synchronously with resetting and reloading the electric-charge storing capacitor Cs of the sub-pixel $49_{m+1}$, the control circuit 35 outputs the control signal $Sig2_{m+1}$ to the switch $SW_{m+1}$ to set the first low-potential line PVSS1 as a low-potential line coupled to the low-potential wiring PVSS for the sub-pixel $49_{m+1}$. Thereafter, when a time period from the update timing $T_0$ of the frame image to the timing $T_1$ in FIG. 8 elapses, the control circuit 35 outputs the control signal $Sig2_{m+1}$ to the switch $SW_{m+1}$ to set the second low-potential line PVSS2 as a low-potential line coupled to the low-potential wiring PVSS for the sub-pixel $49_{m+1}$.

According to the above-described modification, the same effect as in the embodiment can be obtained as a result of switching the low potential side. A decrease in luminance of the sub-pixel 49 that occurs during a period for displaying an image corresponding to one frame can be reduced with the coupling status of the high-potential side kept unchanged.

In the embodiment and the modification (herein after the embodiment and the like), voltages are switched once within a period for displaying a frame image. However, voltages may be switched twice or more within the period. That is, voltage generators for implementing different (n+1) voltages by differences in potential between the high-potential wiring PVDD and the low-potential wiring PVSS may be provided in accordance with the number n of times that voltages are switched (n is a natural number equal to or greater than 1). In a specific example, when n=2, three different voltages need to be implemented. The three different voltages may be implemented by having either of the high-potential wiring PVDD and the low-potential wiring PVSS switched among three potentials or by having each of the high-potential wiring PVDD and the low-potential wiring PVSS switched between two potentials. Specifically, the difference in potential between the high-potential wiring PVDD and the low-potential wiring PVSS can be switched twice in a manner such that, from a state where the first high-potential line PVDD1 is coupled to the high-potential wiring PVDD while the first low-potential line PVSS1 is coupled to the low-potential wiring PVSS, one of the high-potential wiring PVDD and the low-potential wiring PVSS is switched and the other one is then switched. When voltages are switched a plurality of times, voltages on the second high-potential line PVDD2 and the second low-potential line PVSS2 are previously set so that a drain current (ID) in the drive transistor DRT after the switching can be substantially equal to a current that flows at the update timing $T_0$ of a frame image. The control circuit 35 may be configured to store, as data (for example, tabulated data), VD-ID characteristic curves and discharge characteristic curves for the electric-charge storing capacitor Cs corresponding to various gate-source voltages in the drive transistor DRT, and to be enabled to change voltages on the second high-potential line PVDD2, so that timings of the switching and voltages on the second high-potential line PVDD2 can be changed as appropriate based on the data. In such a case, a voltage on the second high-potential line PVDD2 is set so that a voltage in the drive transistor DRT after the switching to the second high-potential line PVDD2 can be substantially equal to a current that flows at the update timing $T_0$ of a frame image.

It should be understood that other functions and effects that would be brought about by aspects described in the embodiment and the like and that are obvious from the description of this specification or are conceivable by the skilled person in the art are naturally included in the present invention.

What is claimed is:

1. A display apparatus comprising:
   a display device including pixels each including a light emitting element;
   a drive transistor coupled to the light emitting element, and
   a capacitor disposed between a gate and a source of the drive transistor, the capacitor storing electric charge;
   a voltage generator configured to generate a plurality of different voltages;
   a switching device configured to be capable of switching the voltages in a manner such that any one of the voltages is applied to each of the pixels; and
   a controller configured to control operation of the switching device, wherein
   at least once during a period for displaying an image corresponding to one frame, the controller is configured to cause the switching device to operate in a manner such that voltages applied to the pixel are switched from a lower to a higher voltage, after completing writing in the capacitor to update a frame image corresponding to the one frame and turning off a gate of the drive transistor to cause the electric charge of the capacitor to be decreased,
   which allows a current flowing through the drive transistor to increase to a current value of a timing to write in the capacitor to update the frame image.

2. The display apparatus according to claim 1, wherein the voltage generator is configured to generate a plurality of high potentials, a low potential and one of the high potentials generating a voltage across the pixel, and
   the switching device is configured to be capable of switching between the high potentials.

3. The display apparatus according to claim 1, wherein the voltage generator is configured to generate a plurality of low potentials, one of the low potentials and a high potential generating a voltage across the pixel, and the switching device is configured to be capable of switching between the low potentials.

4. The display apparatus according to claim 1, wherein the display device is configured to be switchable between
   a high refresh rate mode in which the period for displaying an image corresponding to one frame is relatively short and
   a low refresh rate mode in which the period during which an image corresponding to one frame is displayed is relatively long, and
   the controller causes the switching device to operate when display device is set to the low refresh rate mode.

5. A display apparatus comprising:
   a display device including pixels;
   a voltage generator configured to generate a plurality of different voltages;
   a switching device configured to be capable of switching the voltages in a manner such that any one of the voltages is applied to each of the pixels; and
   a controller configured to control operation of the switching device, wherein
   each of the pixels includes:
      a drive transistor;
      a capacitor disposed between a gate and a source of the drive transistor, that stores therein electric charge according to display output; and
      a light emitting element that lights up with an amount of luminescence according to a current that flows therethrough,
   the drive transistor is provided on a path from which a current according to the voltage generated by the voltage generator is caused to flow into the light emitting element, and sets a current that flows through the light emitting element to a current according to electric charge stored in the capacitor, and
   the controller is configured to cause, at least once during a period for displaying an image corresponding to one frame, the switching device to operate in a manner such that voltages applied to the pixel are switched from a lower to a higher voltage, after completing writing in the capacitor to update a frame image corresponding to the one frame and turning off a gate of the drive transistor to cause the electric charge of the capacitor to be decreased,
   which allows a current flowing through the drive transistor to increase to a current value of a timing to write in the capacitor to update the frame image.

6. A display apparatus comprising:
   a display device including pixels each including a light emitting element;
   a drive transistor coupled to the light emitting element, and
   a capacitor disposed between a gate and a source of the drive transistor, the capacitor storing electric charge;
   a voltage generator configured to generate a plurality of different voltages;
   a switching device configured to be capable of switching the voltages in a manner such that any one of the voltages is applied to each of the pixels; and
   a controller configured to control operation of the switching device,
   wherein
   at least once during a period for displaying an image corresponding to one frame, the controller is configured to cause the switching device to operate in a manner such that voltages applied to the pixel are switched from a lower to a higher voltage, after completing writing in the capacitor to update a frame image corresponding to the one frame, the voltage generator is configured to generate a plurality of high potentials, a low potential and one of the high potentials generating a voltage across the pixel, the switching device is configured to be capable of switching between the high potentials, the high potentials include a first high-potential and a second high-potential that is higher than the first high-potential, at least once during the period for displaying the frame image, the switching device is configured to couple the drive transistor to one of a first high-potential wire to transmit the first high-potential and a second high-potential wire to transmit the second high-potential, and the light emitting element is supplied with a voltage changed from a lower voltage according to a potential difference between the first high-potential and the low potential, to a higher voltage according to a potential difference between the second high-potential and the low potential, after completing writing in the capacitor to update the frame image corresponding to the one frame.

* * * * *